US007012005B2

(12) United States Patent
Lichtenberger et al.

(10) Patent No.: US 7,012,005 B2
(45) Date of Patent: Mar. 14, 2006

(54) SELF-ALIGNED DIFFERENTIAL OXIDATION IN TRENCHES BY ION IMPLANTATION

(75) Inventors: Karl Lichtenberger, Sunnyvale, CA (US); Frederick P. Giles, San Jose, CA (US); Christiana Yue, Milpitas, CA (US); Kyle Terrill, Santa Clara, CA (US); Mohamed N. Darwish, Campbell, CA (US); Deva Pattanayak, Cupertino, CA (US); Kam Hong Lui, Santa Clara, CA (US); Robert Q. Xu, Fremont, CA (US); Kuo-in Chen, Los Altos, CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 10/180,154

(22) Filed: Jun. 25, 2002

(65) Prior Publication Data

US 2003/0235959 A1     Dec. 25, 2003

(51) Int. Cl.
*H01L 21/336* (2006.01)
(52) U.S. Cl. .................. 438/270; 438/528; 438/524
(58) Field of Classification Search ............... 438/270, 438/289, 430, 433, 528, 524, FOR 192
See application file for complete search history.

(56) References Cited

U.S. PATENT DOCUMENTS

| 4,914,058 A | 4/1990 | Blanchard .................... 437/203 |
| 4,967,245 A | 10/1990 | Cogan et al. ............... 357/23.4 |
| 4,992,390 A * | 2/1991 | Chang ......................... 438/270 |
| 5,082,795 A | 1/1992 | Temple ......................... 437/41 |
| 5,183,774 A | 2/1993 | Satoh ........................... 437/52 |
| 5,242,845 A | 9/1993 | Baba et al. .................... 437/40 |
| 5,308,787 A * | 5/1994 | Hong et al. .................. 438/440 |
| 5,372,950 A * | 12/1994 | Kim et al. .................... 438/444 |
| 5,672,889 A | 9/1997 | Brown ........................ 257/77 |
| 5,741,740 A | 4/1998 | Jang et al. ................... 438/435 |
| 5,770,878 A | 6/1998 | Beasom ....................... 257/330 |
| 5,888,880 A | 3/1999 | Gardner et al. ............. 438/424 |
| 5,907,776 A * | 5/1999 | Hshieh et al. ............... 438/270 |
| 5,929,481 A | 7/1999 | Hshieh et al. ............... 257/328 |
| 5,937,310 A * | 8/1999 | Gardner et al. ............. 438/440 |
| 6,063,694 A * | 5/2000 | Togo .......................... 438/440 |
| 6,150,670 A | 11/2000 | Faltermeier et al. |

(Continued)

FOREIGN PATENT DOCUMENTS

JP     09283535     10/1997

OTHER PUBLICATIONS

Patent Abstracts of Japan, Publication No. 09283535, Publication Date Oct. 31, 1997, 1 page.

(Continued)

*Primary Examiner*—George Fourson
(74) *Attorney, Agent, or Firm*—Patent Law Group LLP; Rachel V. Leiterman

(57) ABSTRACT

In accordance with the present invention, a trench MOSFET is formed by creating a trench in a semiconductor substrate. A portion of either a side wall of the trench or the bottom of the trench is implanted with an implant species. An insulating layer is then grown overlying the bottom and side wall of the trench. The implant species is selected such that the insulating layer grows more quickly on the bottom of the trench than on the side wall of the trench, resulting in a thicker insulating layer in the bottom of the trench than on the trench side walls.

6 Claims, 6 Drawing Sheets

U.S. PATENT DOCUMENTS

| | | | |
|---|---|---|---|
| 6,180,490 B1 | 1/2001 | Vassiliev et al. | 438/424 |
| 6,228,720 B1 * | 5/2001 | Kitabatake et al. | 438/268 |
| 6,300,219 B1 | 10/2001 | Doan et al. | 438/424 |
| 6,444,528 B1 | 9/2002 | Murphy | 438/270 |
| 6,445,035 B1 | 9/2002 | Zeng et al. | 257/329 |
| 6,455,378 B1 * | 9/2002 | Inagawa et al. | 438/270 |
| 6,534,365 B1 * | 3/2003 | Kim et al. | 438/270 |
| 2001/0026989 A1 | 10/2001 | Thapar | |
| 2001/0038121 A1 | 11/2001 | Kim et al. | |

OTHER PUBLICATIONS

European Search Report, 3 pages, EP 03253630, Dec. 2004.

* cited by examiner

SELF-ALIGNED DIFFERENTIAL OXIDATION IN TRENCHES BY ION IMPLANTATION

CROSS REFERENCE TO RELATED APPLICATIONS

This application is related to application Ser. No. 09/927, 143, titled "Trench MIS Device With Active Trench Corners And Thick Bottom Oxide And Method Of Making The Same," filed Aug. 10, 2001, and incorporated herein by reference.

BACKGROUND

Description of Related Art

Some metal-insulator-semiconductor (MIS) devices include a gate located in a trench that extends downward from the surface of a semiconductor substrate (e.g., silicon). The current flow in such devices is primarily vertical and, as a result, the cells can be more densely packed than devices with lateral current flow. All else being equal, this increases the current carrying capability and reduces the on-resistance of the device. Devices included in the general category of MIS devices include metal-oxide-semiconductor field effect transistors (MOSFETs), insulated gate bipolar transistors (IGBTs), and MOS-gated thyristors.

Trench MOSFETs, for example, can be fabricated with a high transconductance ($g_{m,max}$) and low specific on resistance ($R_{on}$), which are important for optimal linear signal amplification and switching. One of the most important issues for high frequency operation, however, is reduction of the MOSFET internal capacitances. The internal capacitances include the gate-to-drain capacitance ($C_{gd}$), which is also called the feedback capacitance ($C_{rss}$), the input capacitance ($C_{iss}$), and the output capacitance ($C_{oss}$).

FIG. 1 is a cross-sectional view of a conventional n-type trench MOSFET 10. In MOSFET 10, an n-type epitaxial ("N-epi") layer 13, which is usually grown on an N+ substrate (not shown), is the drain. N-epi layer 13 may be a lightly doped layer, that is, an N− layer. A p-type body region 12 separates N-epi layer 13 from N+ source regions 11. Current flows vertically through a channel (denoted by the dashed lines) along the side wall of a trench 19. The side wall and bottom of trench 19 are lined with a thin gate insulator 15 (e.g. silicon dioxide). Trench 19 is filled with a conductive material, such as doped polysilicon, which forms gate 14. Trench 19, including gate 14 therein, is covered with an insulating layer 16, which may be borophophosilicate glass (BPSG). Electrical contact to source regions 11 and body region 12 is made with a conductor 17, which is typically a metal or metal alloy. Gate 14 is contacted in the third dimension, outside of the plane of FIG. 1.

A significant disadvantage of MOSFET 10 is a large overlap region 18 formed between gate 14 and N-epi layer 13, which subjects a portion of thin gate insulator 15 to the drain operating voltage. The large overlap limits the drain voltage rating of MOSFET 10, presents long term reliability issues for thin gate insulator 15, and greatly increases the gate-to-drain capacitance, $C_{gd}$, of MOSFET 10. In a trench structure, $C_{gd}$ is larger than in conventional lateral devices, limiting the switching speed of MOSFET 10 and thus its use in high frequency applications.

SUMMARY

In accordance with the present invention, a trench MOSFET is formed by creating a trench in a semiconductor substrate. A portion of either a side wall of the trench, or the bottom of the trench, or both the side wall and bottom, is implanted with an implant species. An insulating layer is then grown overlying the bottom and side wall of the trench. The implant species is selected such that the insulating layer grows more quickly on the bottom of the trench than on the side wall of the trench, resulting in a thicker insulating layer in the bottom of the trench than on the trench side walls. In some embodiments, a first implant species is implanted in the bottom of the trench and a second species is implanted in the side wall of the trench. The first implant species is selected to increase the insulating layer growth rate and the second implant species is selected to decrease the insulating layer growth rate. In some embodiments, the first implant species is argon, neon, arsenic, or an inert gas. In some embodiments, the second implant species is nitrogen.

DETAILED DESCRIPTION

Figure 1:
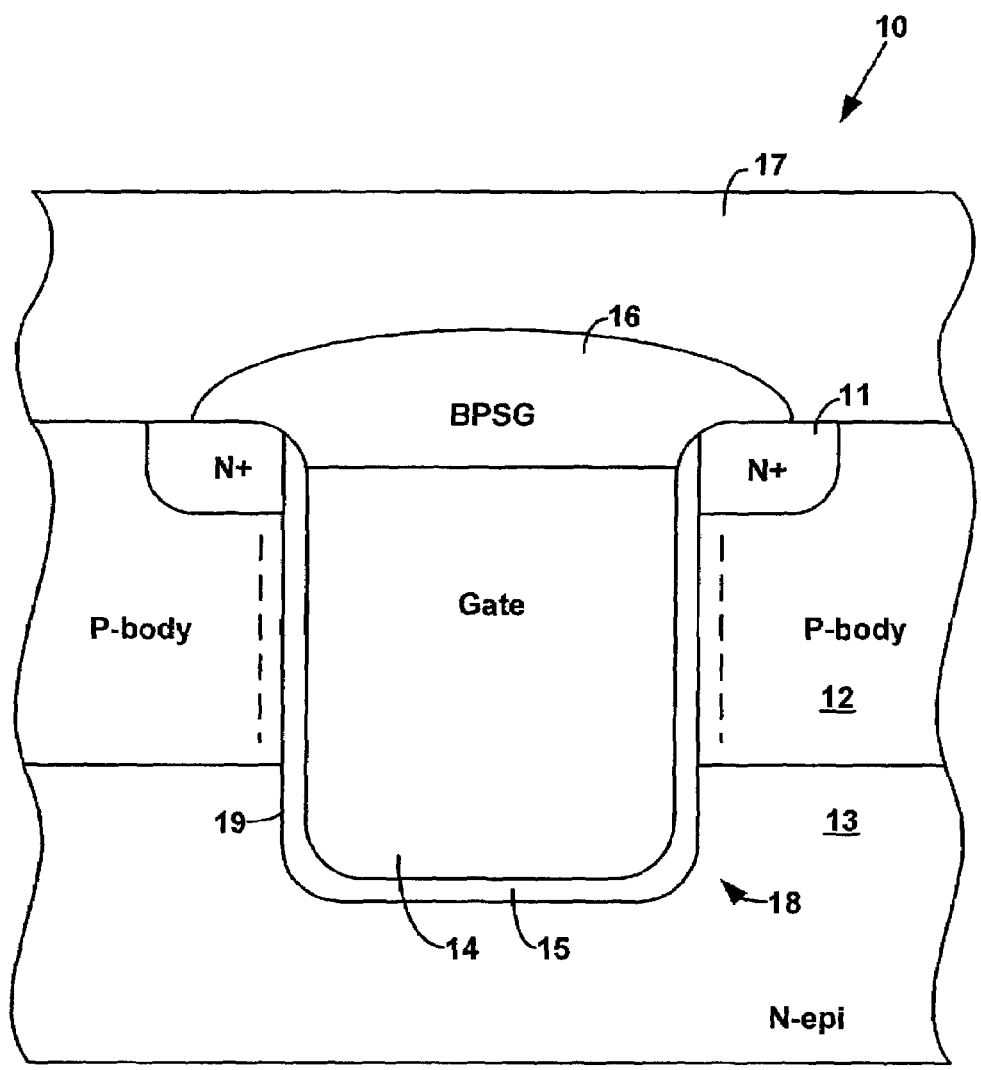
FIG. 1 is a cross sectional view of a conventional trench MOSFET.
Figure 2:
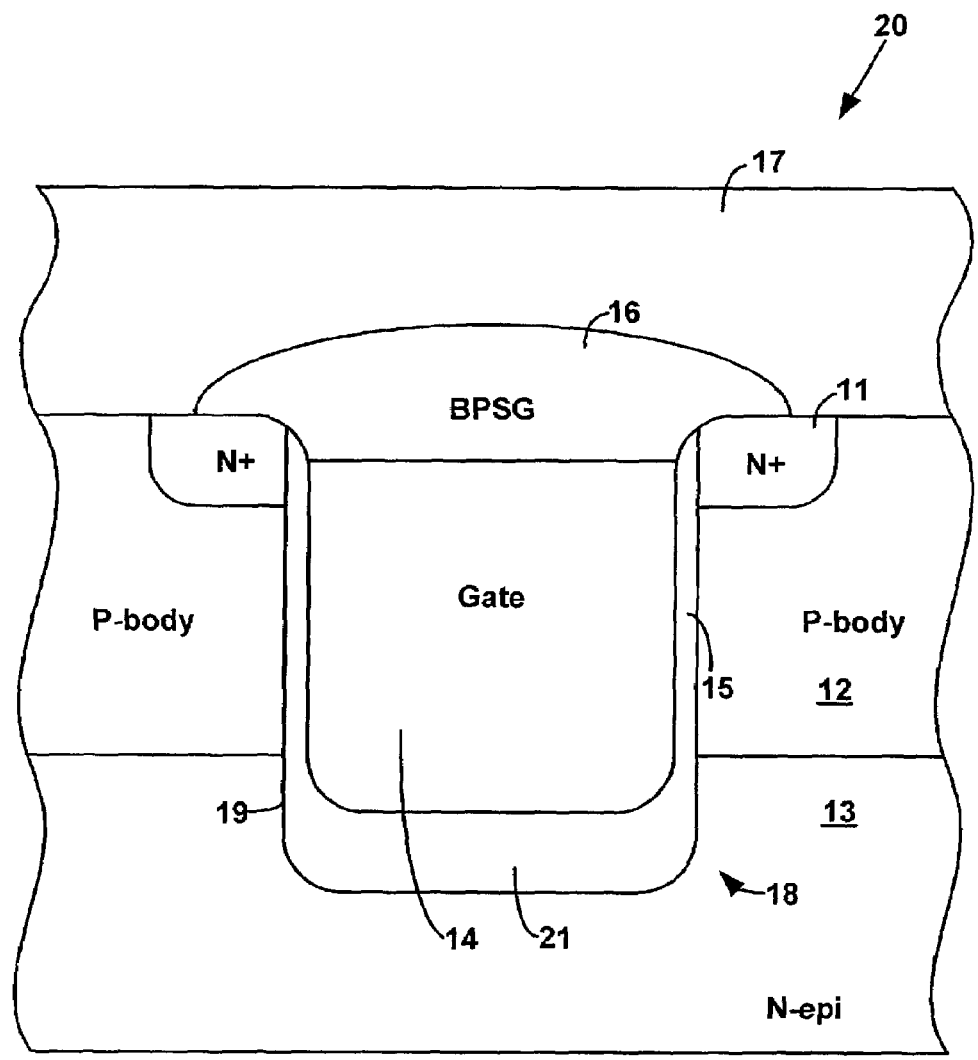
FIG. 2 is a cross sectional view of one embodiment of a trench MOSFET in accordance with the present invention.

FIG. 2 is a cross sectional view of one embodiment of a trench MOSFET 20 in accordance with the present invention. In MOSFET 20, an n-type epitaxial layer 13, which may be an N− layer and is usually grown on an N+ layer (not shown), forms the drain of the MOSFET. A p-type body layer 12 separates the N-epi layer 13 from N+ source regions 11. Body region 12 is diffused along the side wall of a trench 19. Polysilicon gate 14 is formed in trench 19. The side walls of trench 19 are lined with a thin gate insulator 15 (for example, silicon dioxide). A thick insulating layer 21 (for example, silicon dioxide) lines the bottom of trench 19 in MOSFET 20. Thick insulating layer 21 separates gate 14 from N-epi layer 13 (the drain). Thick insulating layer 21 provides a more effective insulator than is achievable with the thin insulating layer 15 lining the bottom of trench 19 in FIG. 1. Thus, thick insulating layer 21 minimizes the gate-to-drain capacitance and yields a trench MOSFET 20 useful for high frequency applications.

FIGS. 3A–3D are cross sectional views illustrating one embodiment of a process for fabricating the trench MOSFET illustrated in FIG. 2. A lightly-doped N-epi layer (typically about 8 µm thick) is grown on a heavily doped N+ substrate. A trench mask, which may be photoresist or an oxide, is deposited on the N-epi layer and patterned to form an opening where the trench is to be located. The trench is etched through the opening in the trench mask, generally using a dry plasma etch such as a reactive ion etch. After the etch, the trench mask is removed to leave the structure shown in FIG. 3A. Trench 19 formed in N-epi layer 13 may be about 0.5 to 1.2 µm wide about 1 to 2 µm deep.

After trench 19 is formed, at least a portion of either the side walls of trench 19, the bottom of trench 19, or both are implanted with an implant species to affect the rate of later oxide formation. The bottom of the trench may be implanted by a zero degree argon, neon, or other inert gas implant, as shown by broken arrows 31 in FIG. 3B. The species implanted in the bottom of trench 19 is selected to increase the rate of oxide growth at the bottom of trench 19. In some embodiments, argon is used because other stages of fabrication require an argon beam for conditioning an implanter, thus the use of argon eliminates the need for additional equipment in order to perform implantation. In some embodiments, a dopant such as arsenic is used.

The presence of argon in the bottom of trench 19 increases the oxide growth rate during a later oxidation step. The table below illustrates the increase in oxide growth rate caused by ion implantation with argon.

| Dose | Oxide Growth Increase |
|---|---|
| 1E15 cm$^{-2}$ | 3% |
| 3E15 cm$^{-2}$ | 30% |
| 5E15 cm$^{-2}$ | 45% |

As illustrated in the above table, oxide will grow at a faster rate on a silicon surface that has been implanted with argon than on a silicon surface that has not been implanted with argon, resulting in a thicker oxide on the implanted surface. Accordingly, by controlling the size of the argon implant region and the concentration of argon implanted, the shape and thickness of the oxide in the bottom of trench 19 can be controlled.

Figure 3A:
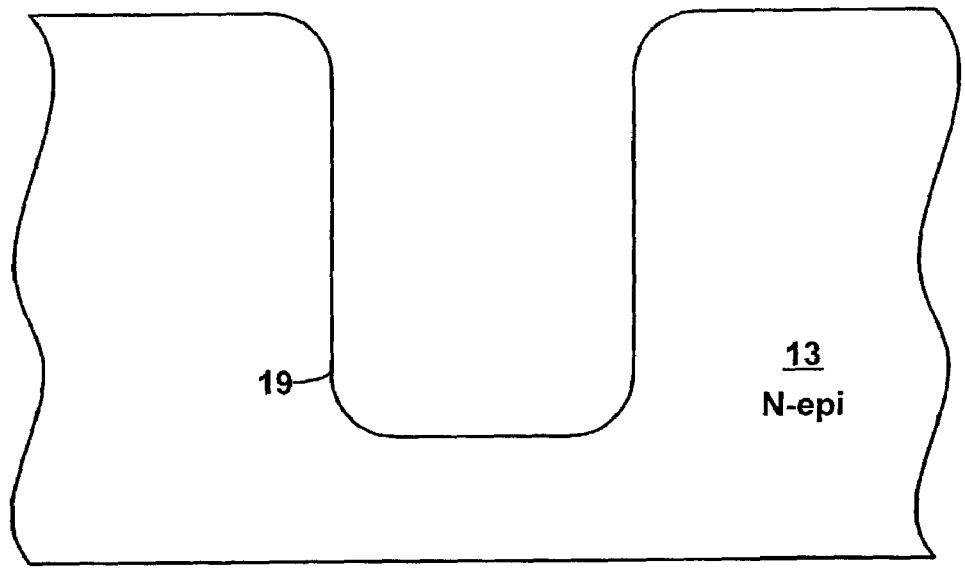
FIGS. 3A–3D are cross sectional views of an embodiment of a trench MOSFET at various stages in fabrication.
Figure 3B:
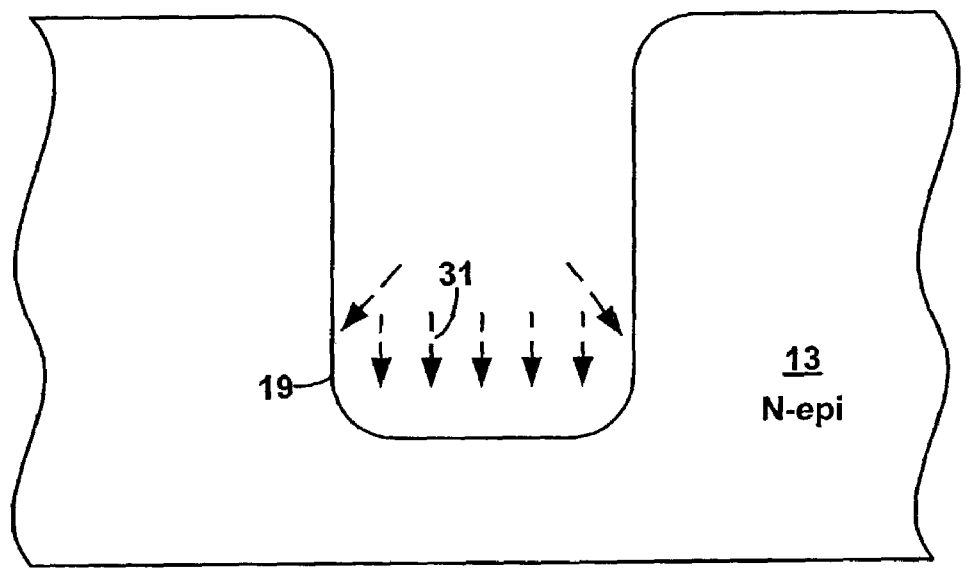
Figure 3C:
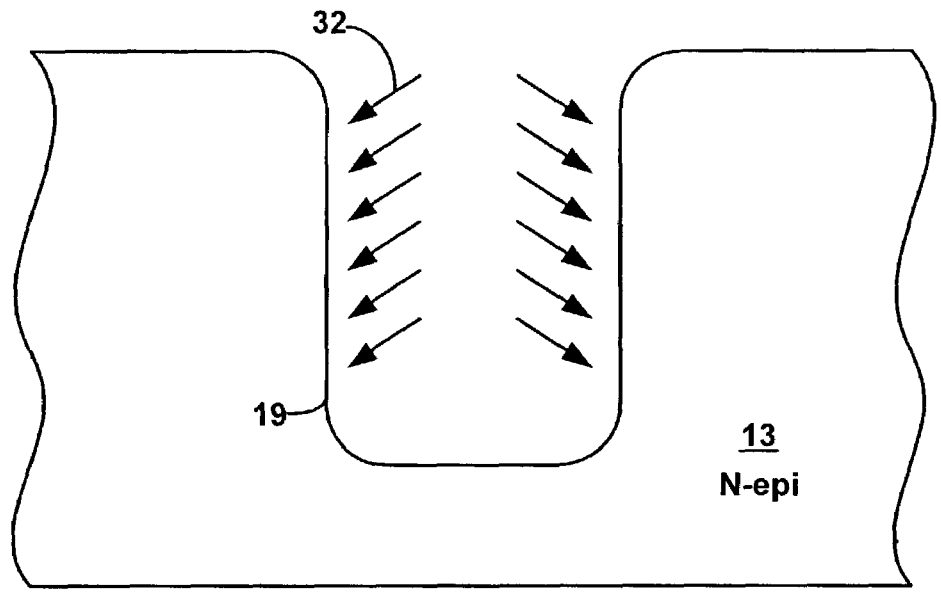

FIG. 3C illustrates another embodiment of the invention, where nitrogen is implanted 32 at a high angle into the side walls of trench 19, using an implanter with large-angle process capability. The nitrogen implantation reduces the oxidation rate. Oxide will grow at a slower rate on a silicon surface that has been implanted with nitrogen than on a silicon surface that has not been implanted with nitrogen, resulting in a thinner oxide on the nitrogen implanted surface.

Figure 3D:
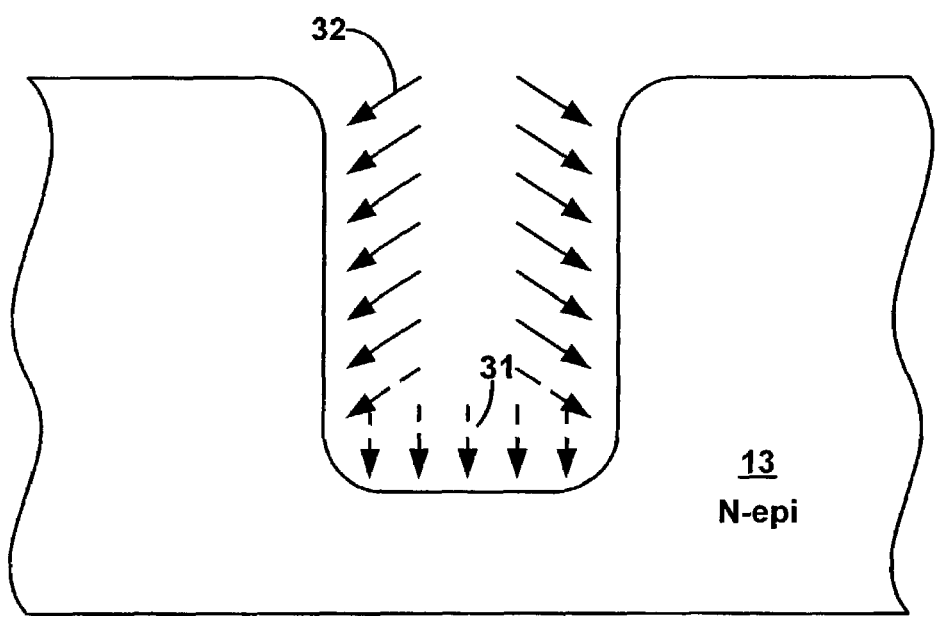

FIG. 3D illustrates another embodiment of the invention, where both the bottom and the side walls of trench 19 are implanted with different species. Argon is implanted into the bottom of trench 19 and a bottom portion of the side walls of trench 19, as illustrated by broken arrows 31. Nitrogen is implanted on the top portion of the side walls of trench 19, as shown by solid arrows 32. This combination of two implants further increases the oxide thickness differential by increasing the oxidation rate in the area of the argon implant and decreasing the oxidation rate in the area of the nitrogen implant. An oxide layer is then grown using a conventional thermal process such as dry oxidation at 1050° C.

Returning now to FIG. 2, conductive material such as in-situ doped polysilicon or an undoped polysilicon that is subsequently implanted and annealed may then be deposited. The conductive material is etched, typically using a reactive ion etch, to form gate 14 such that the top of gate 14 is approximately level with the top of the semiconductor layers. In an n-type MOSFET, gate 14 may be, for example, a polysilicon layer with a doping concentration of $10^{20}$ cm$^{-3}$. Using known implantation and diffusion processes, p-type body regions 12 and N+ source regions 11 are formed in N-epi layer 13. The PN junctions between p-type body regions 12 and the remainder of N-epi layer 13 are usually located at a depth above the interface between thick insulating layer 21 and thin gate insulator 15.

Insulating layer 16, which may be, for example, BPSG, is deposited by CVD on the surface of the device. Insulating layer 16 is etched, typically using a dry etch, to expose portions of p-type body regions 12 and N+ source regions 11. Electrical contact to body regions 12 and N+ source regions 11 is made by conductor 17, which is usually a metal or metal alloy deposited by, for example, physical vapor deposition, plating, sputtering, or evaporation. Electrical contact to the drain (not shown) is made to the opposite surface of the N+ substrate (not shown) on which N-epi layer 14 is grown.

Because inert gas implantation in the bottom of the trench increases the oxidation rate and nitrogen implantation on the side walls of the trench decreases the oxidation rate, the above-described methods are self-aligning, and avoid the use of an etch to control the shape and thickness of layer 21. The method described above thus allows incorporation of a thick insulating layer 21 at the bottom of trench 19 to minimize $C_{gd}$ with minimal undesirable effects or manufacturing concerns which may be caused by other methods such as thermal growth or other deposition techniques. For example, the above-described method avoids stress effects at the concave bottom of trench 19 and thinning of insulating layers at the junction of thick layer 21 with thin layer 15, both of which may be caused by thermal growth of thick layer 21. Also, the above-described method eliminates problems with control of thickness and shape of insulating layer 21, caused by etching to define the shape and thickness of thick layer 21. Such control problems may be encountered when thick layer 21 is deposited by PECVD, then etched to attain the desired shape and thickness of thick layer 21.

Figure 4:
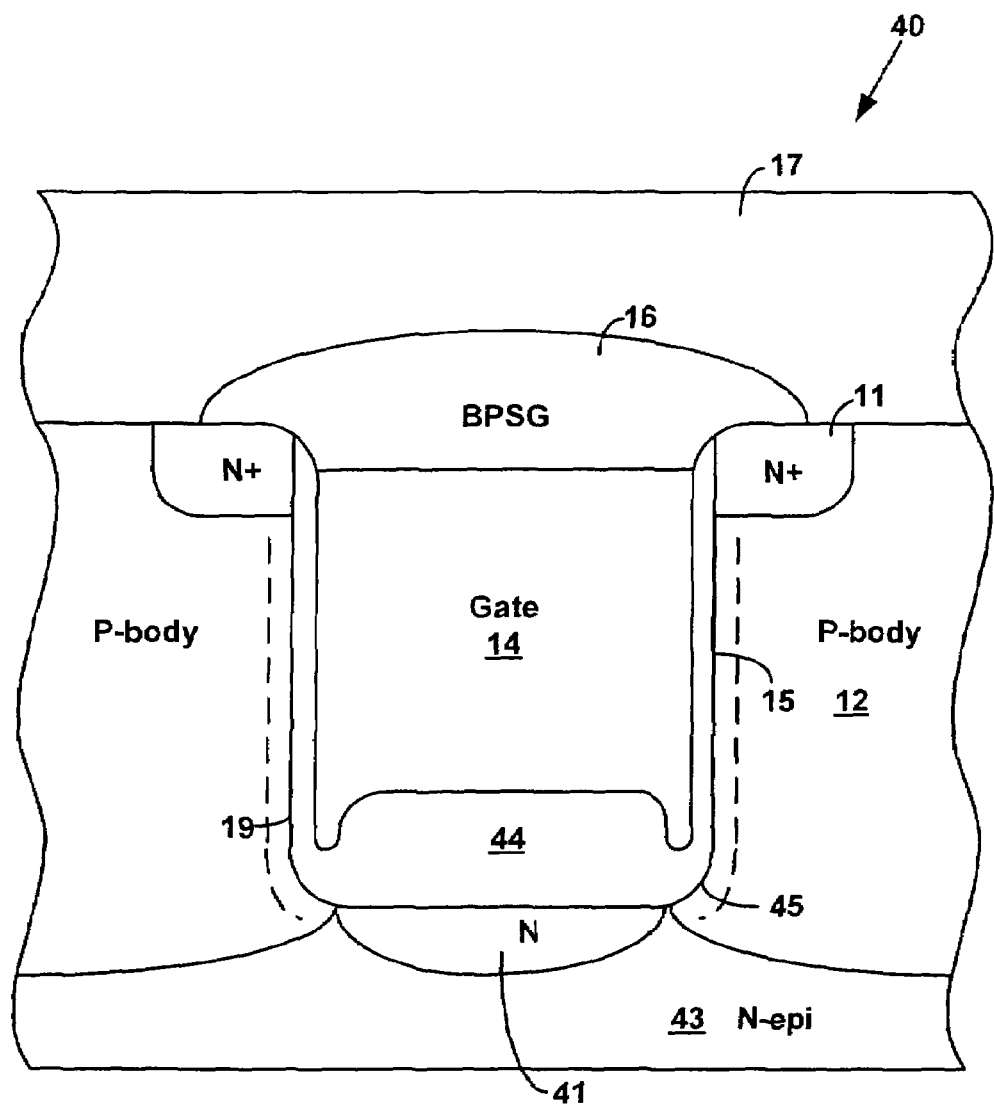
FIG. 4 is a cross sectional view of an alternative embodiment of a trench MOSFET in accordance with the present invention.

FIG. 4 is a cross sectional view of an alternative embodiment of a trench MOSFET 40 in accordance with the present invention. MOSFET 40 has an "active corner" configuration. Current flows vertically through a channel (denoted by dashed lines) along the side wall and around corner region 45 of trench 19. A thick insulating layer 44 is located in the bottom of trench 19. MOSFET 40 may include an optional high conductivity N-type region 41 at the bottom of trench 19 to help spread current more effectively. High conductivity region 41 may be created in N-epi layer 43 by implanting an n-type dopant, such as arsenic or phosphorus, through the bottom of trench 19, before insulating layer 44 is formed.

The trench MOSFET 40 of FIG. 4 uses thick layer 44 to separate gate 14 from N-epi layer 43, thereby decreasing the gate-to-drain capacitance, $C_{gd}$. Having the channel extend around corner region 45 to the bottom of the trench precludes significant gate-to-drain overlap in thin gate oxide regions because the diffusion of body region 12 can be very well controlled through corner region 45. Since lateral diffusion is six to ten times slower than vertical diffusion, the PN junction between body region 12 and N-epi layer 43 can be made to coincide with the transition between thin gate insulator 15 and thick insulating layer 44. Thus, thick layer 44 and active corner region 45 minimize the gate-to-drain capacitance, $C_{gd}$, with minimum impact on on-resistance, $R_{on}$, yielding a trench MOSFET 40 useful for high frequency applications.

Figure 5A:
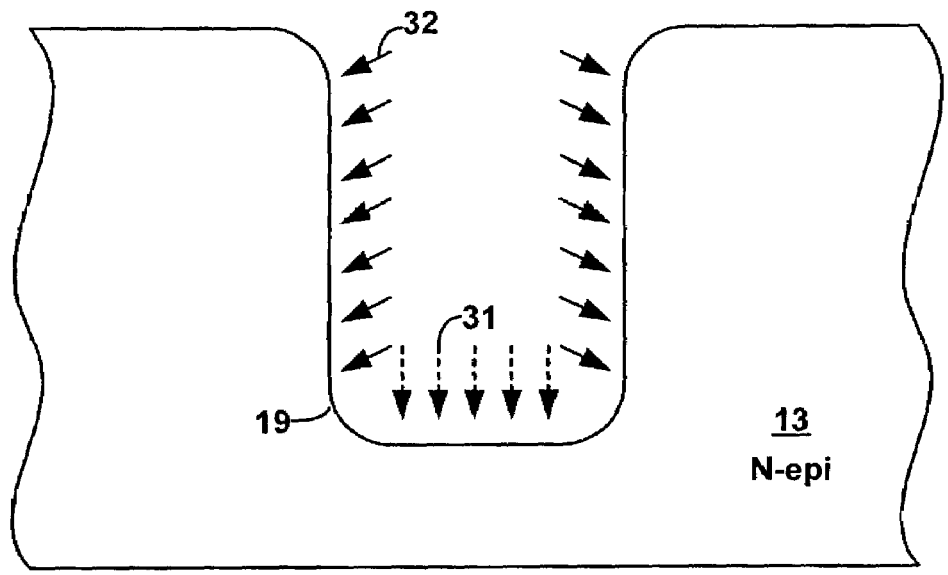
FIGS. 5A–5B are cross sectional views of an embodiment of a trench MOSFET at various stages in fabrication.
Figure 5B:
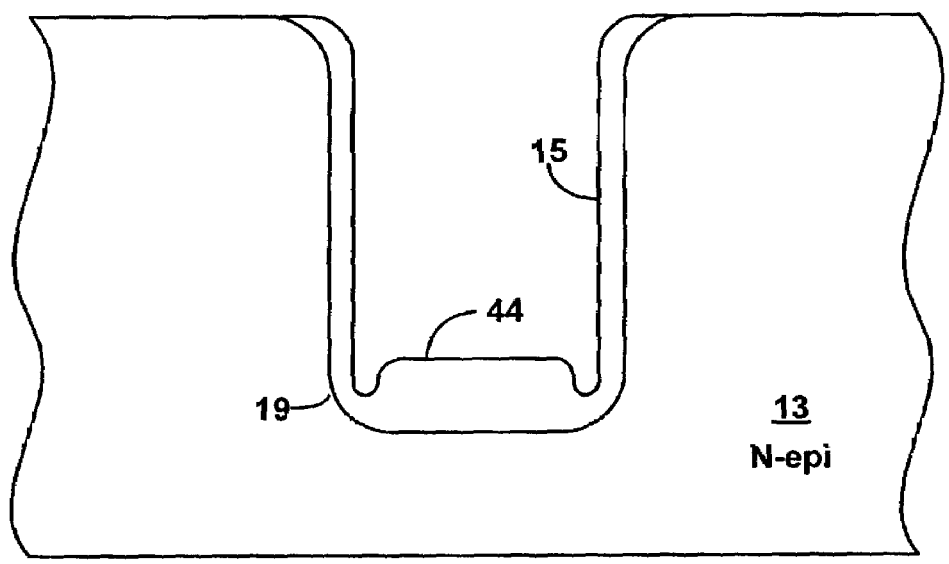

FIGS. 5A and 5B illustrate a MOSFET such as that shown in FIG. 4 at various stages during fabrication. After a trench is formed, an inert gas such as argon may be implanted in the bottom of trench 19 to increase the oxide growth rate, shown by broken arrows 31. Nitrogen may be implanted in the side walls of trench 19 to decrease oxide growth rate, shown by arrows 32. An oxide layer is then grown over the structure shown in FIG. 5A, resulting in the structure shown in FIG. 5B. The implantation scheme shown in FIG. 5A differs from the implantation scheme shown in FIG. 3D in that a smaller area in FIG. 5A is implanted with an inert gas, which causes the thin oxide walls to extend further along the side walls of trench 19. After oxide growth, the rest of the MOSFET may then be fabricated as described above. Though both inert gas implantation and nitrogen implantation are shown in FIG. 5A, either inert gas implantation or nitrogen implantation can be used alone to result in the structure shown in FIG. 5B.

The foregoing embodiments are intended to be illustrative and not limiting of the broad principles of this invention. Many additional embodiments will be apparent to persons skilled in the art. For example, the structures and methods of this invention can be used with any type of metal-insulator-semiconductor (MIS) device in which it is desirable to form an insulating layer between a trench gate and a region outside the trench, while minimizing the gate-to-drain overlap regions. Also, various insulative or conductive materials can be used where appropriate, and the invention is also applicable to p-type MOSFETs. The invention is limited only by the following claims.

What is claimed is:

1. A method of fabricating a trench MOSFET, the method comprising:

providing a semiconductor substrate;

forming a trench in the substrate, the trench comprising a side wall and a bottom;

implanting at least a portion of the bottom of the trench with a first implant species;

implanting at least a portion of the side wall of the trench with a second implant species; and after implanting at least a portion of the bottom of the trench, growing an insulating layer overlying the bottom and side wall of the trench, wherein the insulting layer grown over the bottom is thicker than the insulating layer grown over the side wall;

wherein the first implant species comprises one of Ne and Ar and implantation conditions are selected such that the insulating layer grows more quickly on the bottom of the trench than the side wall.

2. The method of claim 1 wherein the second implant species is nitrogen.

3. The method of claim 1 wherein the insulating layer is silicon dioxide.

4. The method of claim 1 further comprising forming a high conductivity region in the substrate adjacent to a portion of the bottom of the trench.

5. The method of claim 1 further comprising:

forming a body region in the substrate, the body region being located adjacent to the side wall; and forming a source region in the body region, the source region being located adjacent to the side wall and to a top surface of the substrate.

6. The method of claim 1 further comprising depositing doped polysilicon in the trench.

* * * * *